United States Patent
Washio et al.

(10) Patent No.: US 7,846,640 B2
(45) Date of Patent: *Dec. 7, 2010

(54) DEVELOPER COMPOSITION FOR RESISTS AND METHOD FOR FORMATION OF RESIST PATTERN

(75) Inventors: Yasushi Washio, Kawasaki (JP); Koji Saito, Kawasaki (JP)

(73) Assignee: Tokyo Ohka Kogyo Co., Ltd., Kawasaki-shi (JP)

(*) Notice: Subject to any disclaimer, the term of this patent is extended or adjusted under 35 U.S.C. 154(b) by 138 days.

This patent is subject to a terminal disclaimer.

(21) Appl. No.: 10/561,802

(22) PCT Filed: Jun. 22, 2004

(86) PCT No.: PCT/JP2004/009077

§ 371 (c)(1),
(2), (4) Date: Dec. 22, 2005

(87) PCT Pub. No.: WO2005/001578

PCT Pub. Date: Jan. 6, 2005

(65) Prior Publication Data

US 2006/0154158 A1 Jul. 13, 2006

(30) Foreign Application Priority Data

Jun. 27, 2003 (JP) ............................. 2003-184708

(51) Int. Cl.
*G03C 5/00* (2006.01)
(52) U.S. Cl. ...................................... 430/311; 430/309
(58) Field of Classification Search ................. 430/331, 430/309
See application file for complete search history.

(56) References Cited

U.S. PATENT DOCUMENTS

| 3,207,725 | A | * | 9/1965 | Pfeifer ........................ 524/158 |
| 5,300,404 | A | | 4/1994 | Tani et al. |
| 5,543,268 | A | * | 8/1996 | Tanaka et al. ................ 430/331 |
| 5,985,525 | A | | 11/1999 | Sato et al. |
| 6,329,126 | B1 | | 12/2001 | Tanaka et al. |
| 6,451,510 | B1 | | 9/2002 | Messick et al. |
| 6,511,790 | B2 | | 1/2003 | Takamiya |
| 6,900,003 | B2 | * | 5/2005 | Anzures et al. ............. 430/331 |
| 7,063,937 | B2 | * | 6/2006 | Takamiya .................... 430/302 |
| 7,147,995 | B2 | * | 12/2006 | Takamiya .................... 430/331 |
| 2003/0091732 | A1 | | 5/2003 | Kanda |
| 2004/0185371 | A1 | * | 9/2004 | Takamiya ................. 430/270.1 |

FOREIGN PATENT DOCUMENTS

| EP | 0 272 686 A2 | 6/1988 |
| EP | 0 323 836 A2 | 7/1989 |
| JP | 61232453 | 10/1986 |
| JP | 64072154 | 3/1989 |
| JP | 04204454 | 11/1990 |
| JP | 2000155428 | 6/2000 |

* cited by examiner

*Primary Examiner*—Hoa V Le
(74) *Attorney, Agent, or Firm*—Knobbe, Martens, Olson & Bear, LLP

(57) ABSTRACT

A developer composition for resists which has a high dissolution rate (high developing sensitivity). The developer composition for resists comprises an organic quaternary ammonium base as a main component and a surfactant containing an anionic surfactant represented by formula (I).

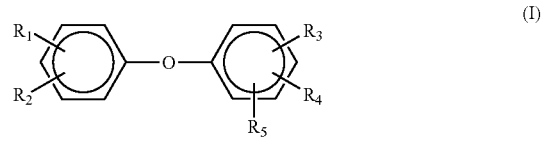

2 Claims, No Drawings

DEVELOPER COMPOSITION FOR RESISTS AND METHOD FOR FORMATION OF RESIST PATTERN

This application is the U.S. National Phase under 35 U.S.C. §371 of International Application PCT/JP2004/009077, filed Jun. 22, 2004, which claims priority to Japanese Patent Application No. 2003-184708, filed Jun. 27, 2003. The International Application was published under PCT Article 21(2) in a language other than English.

TECHNICAL FIELD

The present invention relates to a developer composition for resists, and a method for formation of a resist pattern.

BACKGROUND ART

Resist patterns have hitherto been formed by applying a resist composition on a substrate to form a resist layer, prebaking the resist layer, selectively exposing the prebaked resist layer to light, optionally subjecting it to PEB (post exposure baking), and alkali-developing the exposed resist layer with a developer composition for resists.

As the developer composition for resists, for example, there is known a developer composition obtained by adding an anionic surfactant having a specific ammonium sulfonate group or sulfonic acid-substituted ammonium group to an aqueous solution containing an organic quaternary ammonium salt such as trimethylammonium hydroxide as a main component, as described in Patent Document 1.

[Patent Document 1]

Japanese Patent No. 2589408

However, when the development is conducted by using a conventional developer composition for resists, there arises a problem that a resist layer to be removed by developing has a low rate of dissolution in the developer composition for resists (low developing sensitivity).

Also the resulting resist pattern may have poor dimensional controllability (reproducibility to a mask pattern).

DISCLOSURE OF THE INVENTION

Under these circumstances, the present invention has been made, and an object thereof is to provide a developer composition for resists, which has a high dissolution rate (high developing sensitivity), and a method for formation of a resist pattern using the same.

More preferably, an object of the present invention is to provide a developer composition for resists, which can improve dimensional controllability of a resist pattern, and a method for formation of a resist pattern using the same.

To achieve the above objects, the present invention provides the following aspects.

A first aspect of the present invention is directed to a developer composition for resists, comprising an organic quaternary ammonium base as a main component and a surfactant, said surfactant containing an anionic surfactant represented by the following general formula (I):

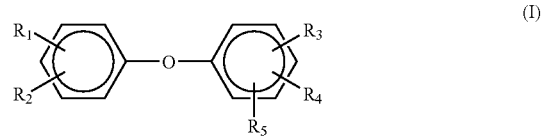

wherein at least one member of $R_1$ and $R_2$ represents an alkyl or alkoxy group having 5 to 18 carbon atoms and any reminder member represents a hydrogen atom, or an alkyl or alkoxy group having 5 to 18 carbon atoms, and at least one member of $R_3$, $R_4$ and $R_5$ represents a group represented by the following general formula (II):

wherein M represents a metal atom, and any reminder member represents a hydrogen atom or a group represented by the above general formula (II).

A second aspect of the present invention is directed to the developer composition for resists of the first aspect, wherein, in the general formula (II), M represents any one selected from sodium, potassium and calcium (provided that, in the general formula (I), when two or more groups represented by the general formula (II) are present, M may be the same or different from each other).

A third aspect of the present invention is directed to a method for formation of a resist pattern, which comprises applying a resist composition on a substrate, followed by prebaking, selective exposure to light and an alkali development with the developer composition for resists of the present invention to form a resist pattern.

In the present specification, an alkyl group, or an alkyl group constituting an alkoxy group may be a straight-chain or branched group.

BEST MODE FOR CARRYING OUT THE INVENTION

[Developer Composition for Resists]

The developer composition for resists of the present invention is a developer composition for resists comprising an organic quaternary ammonium base as a main component (alkali developer), said developer composition further comprising an anionic surfactant represented by the following general formula (I).

Organic Quaternary Ammonium Base

The organic quaternary ammonium base is not specifically limited as long as it is used in a developer composition for resists and, for example, it is a quaternary ammonium base having a lower alkyl group or a lower hydroxyalkyl group. The lower alkyl group or lower hydroxyalkyl group has 1 to 5 carbon atoms, preferably 1 to 3 carbon atoms, and more preferably 1 or 2 carbon atoms.

Among these organic quaternary ammonium bases, tetetramethylammonium hydroxide and trimethyl(2 hydroxyethyl)ammonium hydroxide, i.e. choline, and tetrapropylammonium hydroxide are particularly preferable. These organic quaternary ammonium bases may be used alone or in combination.

The amount of the organic quaternary ammonium base is not specifically limited and is usually from 0.1 to 10% by mass, and preferably from 2 to 5% by mass, based on the developer composition for resists.

The solvent in the developer composition for resists is usually water.

Other Components

In addition to the above-described essential components, the developer for resists may be optionally mixed with additive components conventionally used in a developer for resists of the prior art, for example, wetting agents, stabilizers, solubility aids, and cationic surface active agents for improving the selectivity in the solubility behavior between the exposed and nonexposed areas of a resist layer. These additive components may be added alone or in combination.

Anionic Surfactant

In the present invention, by using the anionic surfactant represented by the above general formula (I), a developer composition for resists having a high dissolution rate (high developing sensitivity) can be obtained. When using this developer composition for resists, scum is less likely to remain after the development. Also film reduction of a resist pattern does not arise and thus good residual film ratio is attained. As a result, good effects are obtained in view of the profile of the resist pattern and dimensional controllability.

It is considered that the developer composition for resists in the field of semiconductors preferably contains a metal such as sodium, potassium or calcium in an amount which is as small as possible. The reason for this is as follows. When ion implantation is carried out through a resist pattern as a mask after a development process of developing with a developer composition for resists and rinsing with pure water, the residual metal such as sodium or potassium as impurities originating from insufficient rinsing can cause undesirable electrical conduction. In the application where a thick resist pattern is formed and connection terminals such as bumps and metal posts are formed by metal coating through the resist pattern as a mask, the same developer composition as in the field of semiconductors has hitherto been used.

However, since the portion with no resist pattern is metal-coated in the application where such a thick resist pattern is formed, unlike the field of the semiconductor that requires the ion implantation process, the residual metal such as sodium, potassium or calcium causes no problem even if present.

Therefore, when using the developer composition for resists of the present invention, no problems arise. Moreover, the use of the developer composition for resists of the present invention exerts an advantageous effect in view of the dissolution rate as compared with the developer composition for resists of the prior art.

In the case in which the required level of the residual amount of sodium, potassium or calcium is low in the field of semiconductors, or the residual amount of sodium, potassium or calcium can be reduced by sufficient rinsing, the developer composition for resists of the present invention can also be used.

In the anionic surfactant represented by the general formula (I), at least one (preferably one or two) of $R_3$, $R_4$ and $R_5$ is a group represented by the general formula (II). In the general formula (II), M is not specifically limited as long as it is a metal atom capable of forming a metal sulfonate salt to form a metal bond, and is preferably sodium, potassium or calcium. In view of the cost, sodium is more preferable.

Provided that, in the general formula (I), when two or more groups represented by the general formula (II) are present, M may be the same or different from each other.

When M is sodium, the general formula (II) is represented by —$SO_3Na$. When M is potassium, the general formula (II) is represented by —$SO_3K$. When M is calcium, the general formula (II) is represented by —$SO_3Ca_{1/2}$. Specific examples of the anionic surfactant represented by the general formula (I) include sodium alkyl diphenyl ether sulfonate, sodium alkyl diphenyl ether disulfonatete, sodium alkyl diphenyl ether sulfonate, potassium alkyl diphenyl ether sulfonate, potassium alkyl diphenyl ether disulfonate, potassium alkyl diphenyl ether disulfonate, calcium alkyl diphenyl sulfonate, and calcium alkyl diphenyl ether disulfonate.

In $R_1$ and $R_2$, an alkyl group has 5 to 18 carbon atoms and may be replaced by an alkoxy group having 5 to 18 carbon atoms.

As a matter of course, these anionic surfactants used in the present invention are not specifically limited and may be used alone or in combination.

Also the other anionic surfactants used generally in the developer composition for resists can be used in combination.

The anionic surfactant represented by the general formula (I), which is indispensable in the present invention, is preferably contained as a main component of the anionic surfactant to be added to the developer composition for resists. As used herein, the main component means that it is not contained as a trace amount of impurities in the anionic surfactant, and preferably means that its amount is largest among anionic surfactants contained in the developer composition for resists. Most preferably, it means that its amount is 50% by mass or more in the anionic surfactant contained in the developer composition for resists.

The amount of the anionic surfactant contained in the developer composition for resists is selected within a range from 500 to 100,000 ppm, and preferably from 1,000 to 50,000 ppm, based on the developer composition for resists. The amount of the anionic surfactant represented by the general formula (I) is preferably adjusted to 50% by mass or more, more preferably 80% by mass or more, and most preferably 100% by mass or more, based on the anionic surfactant. By mixing in the amount within the above range, the effects of the present invention can be improved.

By using 500 ppm or more of the anionic surfactant represented by the general formula (I), it is made possible to improve the wetting behavior and the resolution. By adjusting the amount to 100,000 ppm or less, it is made possible to prevent the selectivity in the solubility behavior between the areas which are irradiated and which are not irradiated with actinic rays from deteriorating, and thus a resist with good profile can be obtained after the development and the heat resistance of the resist can be improved.

[Method for Formation of Resist Pattern]

The resist, to which the developer composition of the present invention is applied, is not specifically limited as long as it can be developed with an alkali developer, and any of positive-working and negative-working resists can be applied.

The method for formation of a resist pattern of the present invention can be conducted in the following manner.

First, the positive-working resist composition is applied on a substrate such as silicon wafer using a spinner or a coater, and then the resulting resin resist layer is prebaked at a temperature of 80 to 150° C. for 40 to 1200 seconds, and preferably 120 to 600 seconds. The prescribed layer is selectively exposed to light through a desired mask pattern, thereafter, the exposed resist layer is subjected to PEB (post exposure baking) at a temperature of 80 to 150° C. for 40 to 600 seconds, and preferably 60 to 300 seconds.

The temperature condition and presence or absence of the PEB step can be appropriately changed according to characteristics of the resist composition. In the case of a chemical amplification type resist composition, the PEB step is usually necessary.

Then, the exposed resist layer is developed using the developer composition for resists of the present invention. In such a manner, a resist pattern faithful to a mask pattern can be obtained.

A dry film type is preferably used as the resist composition.

An organic or inorganic anti-reflection film can also be provided between a substrate and a coating layer made of a resist composition.

In the case of forming a thick resist pattern, the thickness of the resist layer constituting the laminate is within a range from 10 to 150 µm, preferably from 20 to 120 µm, and more preferably from 20 to 80 µm.

By embedding a conductor such as a metal into the non-resist areas of the resist pattern obtained by selective exposure by plating, connection terminals such as metal posts and bumps can be formed. The plating method is not specifically limited and conventionally known various methods can be employed. As a plating solution, solder plating, copper plating, gold plating and nickel plating solutions are used particularly preferably.

The remaining resist pattern is finally removed by using a removing solution according to a conventional procedure.

As described above, a developer solution for resists having a high dissolution rate (high developing sensitivity) can be obtained by using the anionic surfactant represented by the general formula (I) in the present invention. The anionic surfactant enhances penetrability of the developer in the fine patterns and has good detergency and dissolving power so that the resist layer formed on the substrate is completely free from occurrence of deposition of scum or thin film residue in the fine patterns, and also film reduction of the resist does not occur, and thus the resist pattern is excellent in dimensional controllability. Further, the heat resistance of the resulting resist pattern does not deteriorate.

With respect to the dimensional controllability of the resist pattern, there can be obtained a resist pattern having a dimensional tolerance within 110%, and preferably within +5%, based on a target of a mask pattern.

EXAMPLES

The present invention will be described in more detail by way of examples.

Preparation of Developer Composition for Resists

Examples 1 to 15 and Comparative Examples 1 and 2

To an aqueous solution of 2.38% by mass of tetetramethylammonium hydroxide, each of anionic surfactants shown in Table 1 was added to prepare developer compositions for resists with the compositions shown in Tables 1 and 2.

Evaluation

Examples 1 to 12 and Comparative Examples 1 and 2

The developer compositions for resists of Examples 1 to 12 and Comparative Examples 1 and 2 were evaluated in the following manner. Using a spinner, a positive-working photoresist containing a novolak resin and a naphthoquinone diazide compound as a constituent component PMER P-LA900PM (trade name, manufactured by Tokyo Ohka Kogyo Co., Ltd.) was applied on a gold-sputtered wafer 5 inches in diameter at a thickness of 20 µm dried, followed by a pre-baking treatment on a hot plate at 110° C. for 360 seconds to form a photoresist layer.

The photoresist layer thus formed was exposed patternwise to light on an exposure machine (PLA-501F, manufactured by Canon Sales Co., Inc.) through a test chart reticle (mask pattern) and then subjected to a development treatment using a static-paddle development apparatus.

The development treatment was undertaken with the developer composition for resists prepared above at a temperature of 23° C. for 480 seconds by the static-paddle development method, followed by rinsing of the wafer for 30 seconds with pure water and drying.

The target of the test chart reticle had a pattern with a rectangular cross section of 1 to 40 µm in width.

The pattern size of the bottom portion of the resulting resist pattern was measured by cross section SEM (manufactured by Hitachi, Ltd., under the trade name "S4000"). The results are summarized in Table 1.

Evaluation

Example 13

The developer composition for resists of Example 13 was evaluated in the following manner. Using a spinner, a positive-working photoresist containing a novolak resin and a naphthoquinone diazide compound as a constituent component PMER P-LA300PM (trade name, manufactured by Tokyo Ohka Kogyo Co., Ltd.) was applied on a silicon wafer 5 inches in diameter at a thickness of 5 µm dried, followed by a pre-baking treatment on a hot plate at 110° C. for 90 seconds to form a photoresist layer.

The photoresist layer thus formed was exposed patternwise to light on an exposure machine (PLA-501F, manufactured by Canon Sales Co., Inc.) through a test chart reticle (mask pattern) and then subjected to a development treatment using a static-paddle development apparatus.

The development treatment was undertaken with the developer composition for resists prepared as described above at a temperature of 23° C. for 65 seconds by the static-paddle development method, followed by rinsing of the wafer for 30 seconds with pure water and drying.

The target of the test chart reticle had a pattern with a rectangular cross section of 1 to 40 µm in width.

The pattern size of the bottom portion of the resulting resist pattern was measured by cross section SEM (manufactured by Hitachi, Ltd., under the trade name "S4000"). The results are summarized in Table 1.

Evaluation

Example 14

The developer composition for resists of Example 14 was evaluated in the following manner. Using a spinner, a positive-working photoresist containing a novolak resin and a naphthoquinone diazide compound as a constituent component PMER P-LA900PM (trade name, manufactured by Tokyo Ohka Kogyo Co., Ltd.) was applied on a gold-sputtered wafer 5 inches in diameter at a thickness of 50 µm dried, followed by a pre-baking treatment on a hot plate at 110° C. for 600 seconds to form a photoresist layer.

The photoresist layer thus formed was exposed patternwise to light on an exposure machine (PLA-501F, manufactured by Canon Sales Co., Inc.) through a test chart reticle (mask pattern) and then subjected to a development treatment using a static-paddle development apparatus.

The development treatment was undertaken with the developer composition for resists prepared as described above at a temperature of 23° C. for 600 seconds by the static-paddle development method, followed by rinsing of the wafer for 30 seconds with pure water and drying.

The target of the test chart reticle had a pattern with a rectangular cross section of 1 to 40 μm in width.

The pattern size of the bottom portion of the resulting resist pattern was measured by cross section SEM (manufactured by Hitachi, Ltd., under the trade name "S4000"). The results are summarized in Table 1.

Evaluation

Example 15

The developer composition for resists of Example 15 was evaluated in the following manner. Using a spinner, a positive-working photoresist containing a novolak resin and a naphthoquinone diazide compound as a constituent component PMER P-LA900PM (trade name, manufactured by Tokyo Ohka Kogyo Co., Ltd.) was applied on a gold-sputtered wafer 5 inches in diameter at a thickness of 80 μm dried, followed by a pre-baking treatment on a hot plate at 110° C. for 800 seconds to form a photoresist layer.

The photoresist layer thus formed was exposed patternwise to light on an exposure machine (PLA-501F, manufactured by Canon Sales Co., Inc.) through a test chart reticle (mask pattern) and then subjected to a development treatment using a static-paddle development apparatus.

The development treatment was undertaken with the developer composition for resists prepared above at a temperature of 23° C. for 800 seconds by the static-paddle development method, followed by rinsing of the wafer for 30 seconds with pure water and drying. The target of the test chart reticle had a pattern with a rectangular cross section of 1 to 40 μm in width.

The pattern size of the bottom portion of the resulting resist pattern was measured by cross section SEM (manufactured by Hitachi, Ltd., under the trade name "S4000"). The results are summarized in Table 1.

The relative dissolution time as an item for evaluation in the table is a value obtained in the case in which the time required to remove a pattern having a fixed thickness and a fixed area (1 cm in length×1 cm in width×20 μm in thickness) is 1.00 when the anionic surfactant is not added.

The dimensional controllability is evaluated according to the following criteria.

A (Excellent): The formed resist pattern has a dimensional tolerance within ±5% based on a target of a mask pattern.

B (Good): The formed resist pattern has a dimensional tolerance within 110% based on a target of a mask pattern.

C (Poor): The formed resist pattern has a dimensional tolerance over +10% based on a target of a mask pattern.

TABLE 1

| | Anionic surfactant | | Relative | Dimensional | Film |
| --- | --- | --- | --- | --- | --- |
| | Kind | Amount (ppm) | dissolution time | controllability | thickness |
| Example 1 | $C_5H_{11}$—⬡—O—⬡—$SO_3Na$ | 1000 | 0.95 | B | 20 |
| Example 2 | $C_7H_{15}$—⬡—O—⬡—$SO_3Na$ | 2000 | 0.90 | B | 20 |
| Example 3 | $C_{12}H_{25}$—⬡—O—⬡—$SO_3Na$ | 2000 | 0.90 | B | 20 |
| Example 4 | $C_{12}H_{25}$—⬡—O—⬡($SO_3Na$)$_2$ | 3000 | 0.85 | B | 20 |
| Example 5 | $C_{15}H_{31}$—⬡—O—⬡—$SO_3Na$ | 10000 | 0.60 | B | 20 |
| Example 6 | ($C_9H_{19}$)$_2$⬡—O—⬡—$SO_3Na$ | 8000 | 0.70 | B | 20 |

TABLE 1-continued

| | Anionic surfactant | | Relative | Dimensional | Film |
| --- | --- | --- | --- | --- | --- |
| | Kind | Amount (ppm) | dissolution time | controllability | thickness |
| Example 7 | 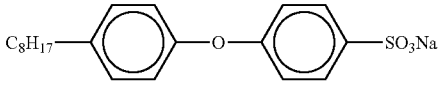 $C_8H_{17}$—⬡—O—⬡—$SO_3Na$ <br> $C_{15}H_{31}$—⬡—O—⬡—$SO_3Na$ | 2500 + 2500 | 0.80 | B | 20 |
| Example 8 | $C_{15}H_{31}$—⬡—O—⬡—$SO_3Na$ | 5000 | 0.75 | B | 20 |
| Example 9 | $C_{12}H_{25}$—⬡—O—⬡(—$SO_3K$)(—$SO_3K$) | 3000 | 0.85 | B | 20 |
| Example 10 | $C_{12}H_{25}$—⬡—O—⬡(—$SO_3Ca_{1/2}$)(—$SO_3Ca_{1/2}$) | 3000 | 0.90 | B | 20 |
| Example 11 | $C_{12}H_{25}$—⬡—O—⬡(—$SO_3Na$)(—$SO_3Na$) | 20000 | 0.50 | A | 20 |
| Example 12 | $C_{12}H_{25}$—⬡—O—⬡(—$SO_3Na$)(—$SO_3Na$) | 50000 | 0.40 | B | 20 |
| Example 13 | $C_{12}H_{25}$—⬡—O—⬡(—$SO_3Na$)(—$SO_3Na$) | 3000 | 0.85 | B | 5 |
| Example 14 | $C_{12}H_{25}$—⬡—O—⬡(—$SO_3Na$)(—$SO_3Na$) | 3000 | 0.85 | B | 50 |
| Example 15 | $C_{12}H_{25}$—⬡—O—⬡(—$SO_3Na$)(—$SO_3Na$) | 3000 | 0.85 | B | 80 |
| Comparative Example 1 | $C_{12}H_{25}$—⬡—O—⬡(—$SO_3NH_4$)(—$SO_3NH_4$) | 10000 | 1.20 | B | 20 |
| Comparative Example 2 | — | — | 1.00 | C | 20 |

It could be confirmed from the results shown in Table 1, that the resulting developer compositions for resists of the present invention have a high dissolution rate. Also, the developer compositions had good dimensional controllability.

EFFECTS OF THE INVENTION

As described above, the present invention can provide a developer composition for resists, which has a high dissolution rate (high developing sensitivity), and a method for formation of a resist pattern using the same.

More preferably, the present invention can provide a developer composition for resists, capable of improving the dimensional controllability of a resist pattern, and a method for formation of a resist pattern using the same.

INDUSTRIAL APPLICABILITY

The present invention provides a developer composition for resists, which has a high dissolution rate (high developing sensitivity), and a method for formation of a resist pattern using the same, and is therefore extremely useful for industries.

The invention claimed is:

1. A developer composition for positive resists, comprising 2 to 5% by mass of tetramethylammonium hydroxide and a surfactant in an aqueous solution, said surfactant containing an anionic surfactant represented by the following general formula (I):

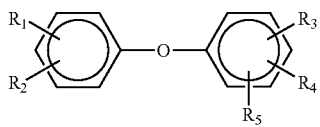

(I)

wherein at least one member of $R_1$ and $R_2$ represents an alkyl or alkoxy group having 5 to 18 carbon atoms and any remaining member represents a hydrogen atom, or an alkyl or alkoxy group having 5 to 18 carbon atoms, and at least one member of $R_3$, $R_4$ and $R_5$ represents a group represented by the following general formula (II):

$$-SO_3M \qquad (II)$$

wherein M represents a metal atom selected from the group consisting of sodium, potassium, and calcium, and any remaining member represent a hydrogen atom or a group represented by the above general formula (II), provided that, in the general formula (I), when two or more groups represented by the general formula (II) are present, M may be the same or different, wherein the amount of said anionic surfactant is in the range of 1,000 to 50,000 ppm based on said developer composition, and wherein said positive resists comprise a novolak resin and a naphthoquinone diazide compound.

2. A method for formation of a resist pattern, comprising applying a resist composition on a substrate to form a resist layer, prebaking the resist layer, selectively exposing the prebaked resist layer to light, and alkali-developing the exposed resist layer with the developer composition for resists according to claim 1 to form a resist pattern.

* * * * *